United States Patent [19]

Kaplo et al.

[11] Patent Number: 5,522,602

[45] Date of Patent: Jun. 4, 1996

[54] EMI-SHIELDING GASKET

[75] Inventors: Joseph J. Kaplo, Pittsford, N.Y.; Peter E. Mertinooke, Amesbury, Mass.; Alan J. DeMello, Newmarket, N.H.

[73] Assignee: Amesbury Group Inc., Amesbury, Mass.

[21] Appl. No.: 981,618

[22] Filed: Nov. 25, 1992

[51] Int. Cl.[6] ............................. F16J 15/02; H05K 9/00
[52] U.S. Cl. ...................... 277/53; 277/901; 174/35 GC; 174/35 MS
[58] Field of Search ................ 277/901, 53; 174/35 GC, 174/35 MS

[56] References Cited

U.S. PATENT DOCUMENTS

| | | | |
|---|---|---|---|
| 3,889,043 | 6/1975 | Ducros | 277/901 X |
| 3,916,054 | 10/1975 | Long et al. | 277/53 X |
| 3,962,550 | 6/1976 | Kaiserswerth | 277/901 X |
| 4,037,009 | 7/1977 | Severinsen | 428/241 |
| 4,042,737 | 8/1977 | Forsgren et al. | 428/96 |
| 4,130,535 | 12/1978 | Coran et al. | 260/33.6 |
| 4,311,628 | 1/1982 | Abdou-Sabet et al. | 260/33.6 |
| 4,434,541 | 3/1984 | Powers, Jr. | 29/526 R |
| 4,435,465 | 3/1984 | Ebneth et al. | 428/195 |
| 4,471,015 | 9/1984 | Ebneth et al. | 428/195 |
| 4,539,433 | 9/1985 | Ishino et al. | 174/35 |
| 4,647,495 | 3/1987 | Kanayama et al. | 428/246 |
| 4,678,699 | 7/1987 | Kritchevsky et al. | 428/175 |
| 4,681,591 | 7/1987 | Okayasu et al. | 8/115.68 |
| 4,699,818 | 10/1987 | Evans et al. | 428/85 |
| 4,749,625 | 6/1988 | Obayashi et al. | 174/35 MS X |
| 4,792,645 | 12/1988 | Nakao et al. | 174/126.4 |
| 4,823,229 | 4/1989 | Waterland, III | 277/901 X |
| 4,825,015 | 4/1989 | Prott et al. | 174/35 GC |
| 4,857,668 | 8/1989 | Buonanno | 174/35 GC |
| 4,898,760 | 2/1990 | Halberstadt et al. | 428/122 |

(List continued on next page.)

FOREIGN PATENT DOCUMENTS

| | | |
|---|---|---|
| 20058876 | 9/1982 | European Pat. Off. . |
| 2647610 | 11/1990 | France . |
| 12533815 | 2/1977 | Germany . |
| 0027480 | 7/1980 | Japan . |
| 0152299 | 6/1990 | Japan ................ 174/35 GC |
| 0089599 | 4/1991 | Japan . |
| 0196699 | 8/1991 | Japan . |

OTHER PUBLICATIONS

IBM Technical Disclosure Bulletin, vol. 22 No. 8A, Jan. 1980, R. T. Evans et al.
Travieso (1976) IBM Technical Disclosure Bulletin, vol. 19, No. 7.
Crosby et al. (1985) Modern Plastics Encyclopedia, pp. 381–382.
(1992) LNP Engineering Plastics Catalogue, pp. 2–8.
Patent Abstracts of Japan–unexamined applns M section vol. 11, No. 120, Apr. 15, 1987.
*IBM Technical Disclosure Bulletin*, vol. 20, No. 1, Jun. 1977 pp. 282–283, (Crosby: "Conductive Seal for Electromagnetic Shielding in Electrical Enclosure".

*Primary Examiner*—William A. Cuchlinski, Jr.
*Assistant Examiner*—John L. Beres
*Attorney, Agent, or Firm*—Testa, Hurwitz & Thibeault

[57] ABSTRACT

One embodiment of a gasket for shielding electromagnetic interference passing through a seam between first and second electrically conductive bodies includes a base for securing the gasket to the first, electrically conductive body and a multiplicity of discrete, elongate, metallized filaments projecting substantially perpendicularly from the base so that a substantial amount of the filaments contacts the second, electrically conductive body when electromagnetic interference passing through a seam between the bodies is to be shielded. The gasket further includes structure, arranged with the base, for providing an electrically conductive path for conducting electric current between the filaments and the first, electrically conductive body. In this manner, energy absorbed the shielding member as a result of the shielding of passing electromagnetic interference can be dissipated to ground through the first, electrically conductive body. The gasket is particularly useful for shielding electromagnetic energy passing through seams between electrical apparatus housings and door or access panels in such housings.

28 Claims, 3 Drawing Sheets

U.S. PATENT DOCUMENTS

| | | | |
|---|---|---|---|
| 4,900,877 | 2/1990 | Dubrow et al. | 174/35 GC |
| 4,909,910 | 3/1990 | Morin | 204/28 |
| 4,910,090 | 3/1990 | Kuhlman et al. | 428/469 |
| 4,931,326 | 6/1990 | Weil | 428/35.8 |
| 4,935,296 | 6/1990 | Stevens | 428/288 |
| 4,943,477 | 7/1990 | Kanamura et al. | 428/286 |
| 4,977,295 | 12/1990 | Chin et al. | 174/35 |
| 5,023,394 | 6/1991 | Watanabe et al. | 174/35 R |
| 5,028,490 | 7/1991 | Koskenmaki et al. | 428/594 |
| 5,043,528 | 8/1991 | Mohr | 174/35 GC |
| 5,045,635 | 9/1991 | Kaplo et al. | 174/35 GC |
| 5,070,216 | 12/1991 | Thornton | 174/35 GC |
| 5,074,748 | 12/1991 | Hagle | 277/53 X |
| 5,079,388 | 1/1992 | Balsells | 174/35 |
| 5,108,116 | 4/1992 | Johnson et al. | 277/53 |
| 5,110,651 | 5/1992 | Massard et al. | 428/105 |
| 5,115,104 | 5/1992 | Bunyan | 174/35 GC |
| 5,115,140 | 5/1992 | Rodriguez | 250/516.1 |
| 5,202,536 | 4/1993 | Buonanno | 174/35 GC |

EMI-SHIELDING GASKET

BACKGROUND OF THE INVENTION

The invention relates generally to the field of gaskets for shielding electromagnetic interference (EMI). In particular, the invention concerns gaskets which include EMI shielding members supported by resilient structures such as, in some embodiments, a multiplicity of discrete, elongate filaments which may or may not be electrically conductive.

Most electronic equipment generates unwanted electromagnetic energy during operation which, if not properly shielded, can interfere with other electronic equipment by way of radiation and/or conduction. This can include electromagnetic energy of wavelengths along various points of the spectrum such as radio frequency interference. As used herein, therefore, the term electromagnetic interference pertains to interfering electromagnetic energy of any wavelength.

To avoid the problems associated with electromagnetic interference, all sources of electromagnetic energy should be properly shielded and grounded. Shielding should be designed to prevent both incoming and outgoing interference. In the case of equipment permanently contained in a housing, effective shielding can be accomplished through proper construction of the housing. It is difficult to shield effectively, however, equipment having access panels or doors. This is because the seams between the access panels or doors and the housing body provide natural escape and entry routes for electromagnetic interference. In the case of metal housings, gaps can also inhibit the beneficial Faraday Cage effect by presenting conductivity discontinuities in the electrically conductive surfaces of the housings. The gaps also reduce the efficiency of the ground conduction path. Moreover, by presenting an electrical conductivity level which is significantly different from that of the housing, the gaps can act as slot antennae and result in the housing becoming a secondary source of EMI radiation.

In the case of electrical apparatus housings which include seams, therefore, an effective shielding mechanism must be configured both to provide sufficient EMI shielding characteristics and to allow proper closure of the door or access panel. Various configurations of gaskets have been developed for serving these purposes. They are intended to provide maximum EMI shielding, while minimizing the force required to close the door or access panel.

To present an effective shield to electromagnetic interference, a gasket should be capable of absorbing and/or reflecting electromagnetic interference and of establishing as continuous an electrically conductive path as possible across the seam in which the gasket is positioned. Typically, metallic structures are used for EMI shielding because of their high degree of electrical conductivity. Because that conductivity is not infinite, however, part of the electromagnetic field being shielded is transmitted across the shield and supports a current in the shield. Accordingly, an effective EMI shielding gasket should provide an electrically conductive path for dissipating this current to ground, otherwise the current could serve to radiate an electromagnetic field on the other side of the shield.

Known EMI shielding gaskets have been unable to combine effectively these qualities with the other requirements of suitable gaskets, such as presenting a consistent, minimal closure resistance. Another important characteristic of an EMI shielding gasket is that it not break down due to galvanic corrosion, such as can occur when dissimilar metals are in contact with one another.

It is an object of the invention, therefore, to provide a gasket which affords improved shielding of electromagnetic interference passing through seams in electronic apparatus housings. Another object of the invention is to provide such a gasket which is of a simple, cost effective construction. Still another object of the invention is to provide such a gasket which presents a narrow profile and thereby presents a minimum of closure resistance to housing doors and access panels.

SUMMARY OF THE INVENTION

These and other objects are achieved by the present invention which features a gasket for shielding electromagnetic interference passing through a seam between first and second electrically conductive bodies. For example, the invention is suitable for shielding electromagnetic interference passing through a seam between a door or access panel and a housing wall of a piece of electronic equipment.

In one embodiment, the gasket includes a base for securing the gasket to the first, electrically conductive body and an EMI-shielding member projecting substantially perpendicularly from the base to contact the second body when EMI passing through the seam between the bodies is to be shielded. Resilient means is arranged to cooperate with the EMI shielding member to position properly the shielding member throughout repeated openings and closings of the door or access panel. The gasket further includes electrically conductive means arranged with the base for conducting electric current between the shielding member and the first, electrically conductive body. In this manner, energy which is absorbed by the shielding member can be dissipated to ground.

In various embodiments of the invention, the shielding member can be metallized cloth, strands of metallic wire, metallized yarn, or combinations thereof. The electrically conductive means can be conductive particles embedded in the base such as electrically conductive carbon, a conductive coating laid over the base, a conductive skin wrapped around the base, or combinations thereof. The base itself can also be formed of an electrically conductive material.

The resilient means for supporting the EMI shielding member can be a thermoplastic elastomeric foam substrate, an electrically conductive polymer backing, or a multiplicity of discrete, elongate filaments arranged against the shielding member. In some embodiments of the invention, the filaments are electrically conductive and help complete the electrically conductive path for dissipating absorbed energy to ground. In other embodiments, the filaments includes non-electrically conductive filaments, which are provided for their ability to shield environmental effects such as wind, dust, and noise.

In some embodiments of the invention, EMI shielding is provided by a multiplicity of discrete, elongate, metallized filaments which project substantially perpendicularly from the base. The filaments act has hundreds of individual "walls" inhibiting the passage of electromagnetic waves. In these embodiments of the invention, energy which is absorbed by the filaments is dissipated to ground via an electrically conductive path formed in any of a number of ways such as are described above. For example, electric current may flow from the metallized filaments to ground via an electrically conductive coating laid over the base, an electrically conductive covering enveloping the base, electrically conductive particles embedded in the base, or the base itself. Also, the metallized filaments can be attached to the base in such a way that a portion of the filaments extends through the base to contact on the back of the base a connection to an electric current path to ground.

These and other features of the invention will be more fully appreciated by reference to the following detailed description which is to be read in conjunction with the attached drawing.

DETAILED DESCRIPTION

As stated, the invention features a gasket for shielding electromagnetic interference passing through a seam between first and second electrically conductive bodies. The gasket includes structure for reflecting and/or absorbing passing EMI, and for dissipating absorbed energy to ground via one or both of the electrically conductive bodies.

Figure 1:
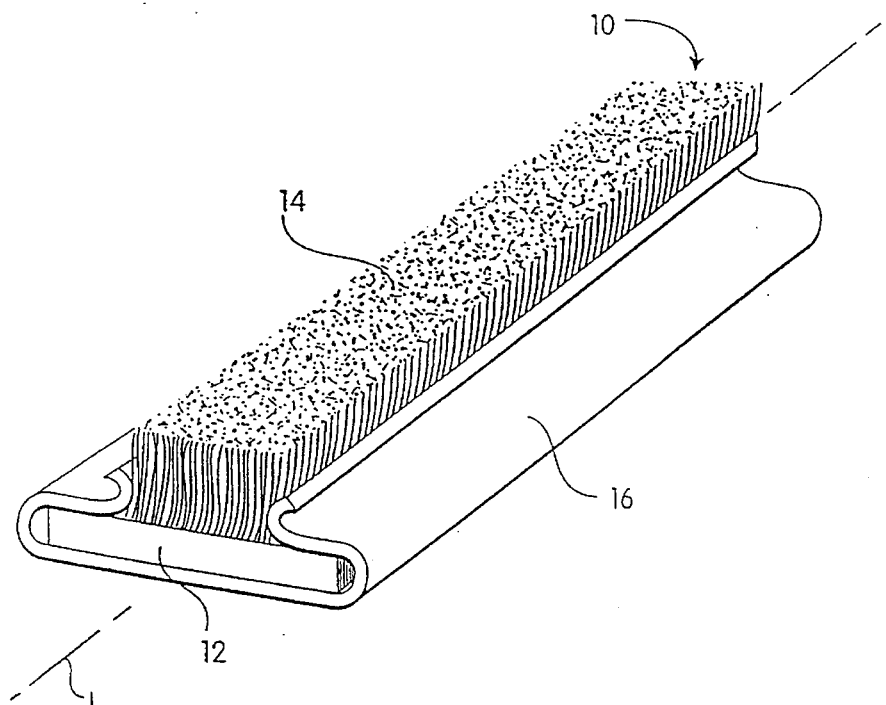
FIG. 1 is a perspective view of an inventive EMI shielding gasket including metallized filaments.

FIG. 1 shows an EMI shielding gasket 10 constructed in accordance with one embodiment of the invention. The gasket 10 includes a base 12 which has a rectangular cross-section and is elongated along an axis L. The base 12 is typically approximately one quarter of an inch wide and can be cut to any length. For a specified application the width of the base can be set appropriately and will typically be between approximately 0.1 inches and approximately 0.5 inches. As illustrated, the gasket 10 has a strip-like appearance. It should be appreciated, however, that the base 12 can be configured in virtually unlimited ways depending upon the application for which the gasket 10 is constructed. For example, the base 12 may include various attachment mechanisms, such as arms and barbs, for securing the gasket 10 to various types of analogous substrates. These variations will be readily apparent to those skilled in the art and are therefore not described herein with great detail.

A multiplicity of discrete, elongate filaments 14 project substantially perpendicularly from the base 12. The filaments 14 provide the gasket 10 with its EMI shielding capability. For this purpose, the filaments 14 include a metallic component. For example, silver metallized nylon multifilament yarn, 1800 denier scale, is suitable for use as the filaments 14. Typically, after the filaments 14 have been properly secured to the base 12 they are cut to a length of approximately one-eight of an inch. Of course, however, depending on the application for which the gasket 10 is intended, this length can be altered.

Figure 2:
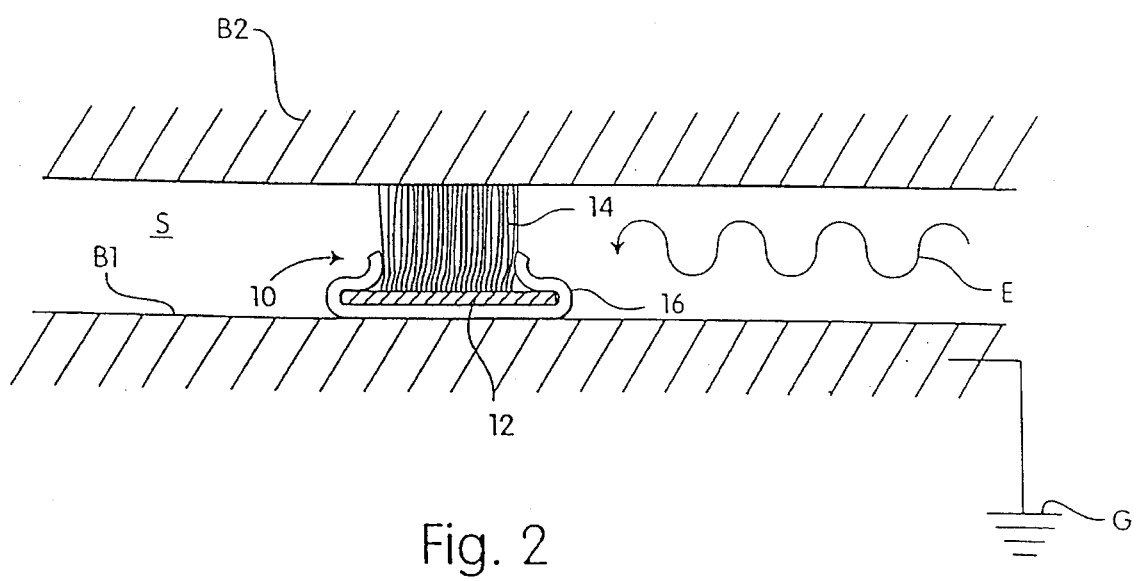
FIG. 2 is a cross-section view of the gasket shown in FIG. 1, the gasket being arranged in a seam between two bodies.

An electrically conductive skin 16 surrounds a portion of the base 12 and is arranged in contact with some of the filaments 14. As more clearly evident in FIG. 2, the skin 16 provides a path for the flow of current from the filaments 14 to ground G. In the figure, it is shown that the gasket 10 is constructed for placement in a seam S between two electrically conductive bodies B1 and B2.

As schematically represented in the figure, electromagnetic energy wave E is shielded by the gasket 10 as the field E passes through the seam S. The filaments 14 reflect part of the energy of the electromagnetic field E and absorb part of the field E, dependent upon the impedance of the field and the conductivity of the filaments 14. Since the filaments 14 are not perfect conductors, energy absorbed by the filaments induces a current which, to ensure the effective operation of the gasket as an EMI shield and avoid electrostatic discharge, should be dissipated to ground G. This is achieved via the electrically conductive skin 16. Additionally, the electrically conductive skin 16 helps provide electrical conductivity across the seam S, thereby helping to preserve the benefits of the Faraday Cage effect discussed above.

Various electrically conductive materials are suitable for use as the conductive skin 16. For example, mixing approximately 85% by weight of thermoplastic rubber and approximately 15% by weight of electrically conductive carbon black forms a compound which can be extruded like a skin over the base 12 and which provides an efficient electrically conductive path for dissipating accumulated electric charge as discussed above. A suitable extrusion process is described in the commonly assigned, co-pending U.S. patent application Ser. No. 07/650,974 (now U.S. Pat. No. 5,192,586) to Mertinooke et. al., the teachings of which are hereby incorporated herein by reference.

Many other techniques are available for completing the electrically conductive path from the filaments 14 to the body B1. For example, the base 12 can be covered with a coating including a dispersion of conductive particles such as silver, nickel, carbon, or graphite particles. Alternatively, a conductive covering such as a metal foil can be used. It is also possible to form the base out of a conductive material such as any suitable metal or to embed conductive particles such as carbon or graphite in the base.

An advantage provided by the EMI shielding gasket 10 over known EMI shielding gaskets stems from each of the shielding filaments 14 acting as an individual EMI shielding wall. Most known EMI shielding gaskets, on the other hand, provide only one or two EMI shielding walls. Enhanced EMI shielding is provided by the gasket 10, therefore, because, among other reasons, hundreds of individual filaments 14 each acts as an EMI shield.

Figure 3:
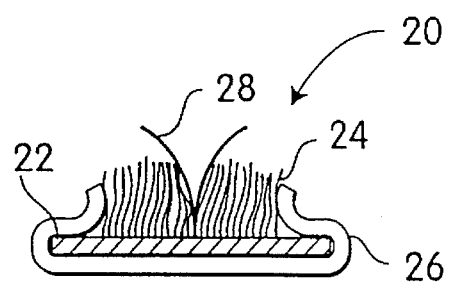
FIG. 3 is a cross-section view of an inventive EMI shielding gasket including conductive filaments and a metallic shielding member.

Another embodiment of the invention is shown in FIG. 3 which is a cross-section view of an EMI shielding gasket 20 including an EMI shielding member 28. Various configurations of EMI shielding materials are available for use as the shielding member 28. For example, the member 28 can be formed of polyester nonwoven fabric which has been metallized on both sides with copper over a 1.5 thousandths of an inch thick polypropylene film laminate. The member can also be formed of woven metal strands or metallized yarns. Combinations of these materials can be used as well. The gasket 20 also includes electrically conductive filaments 24 and a conductive covering 26 laid over a base 22.

Notably, the shielding member 28 is in electrical contact with the electrically conductive filaments 24. This enables electric current to flow from the shielding member 28 through the filaments 14, to the conductive covering 26 and then on to ground as discussed above. Significantly, in this embodiment of the invention, since effective EMI shielding is provided by the shielding member 28, the filaments 24 need only to be electrically conductive, they do not necessarily have to include a highly conductive, metallic component for EMI shielding. While utilizing filaments including a metallic component will provide even better EMI shielding, in applications where sufficient shielding is obtained by the shielding member 28 alone, only electrical conductivity sufficient for charge dissipation is required of the filaments 24. In such applications, the filaments may be formed, for example, of electrically conductive polymer fibers.

Figure 4:
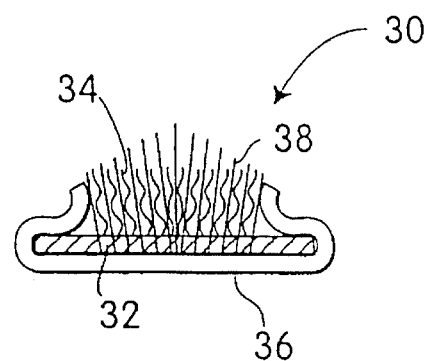
FIG. 4 is a cross-section view of an inventive EMI shielding gasket including non-conductive and metallized filaments.
Figure 5:
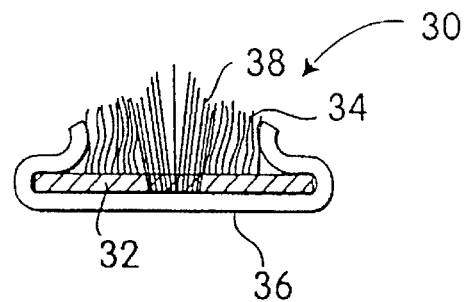
FIG. 5 is a cross-section view of another inventive EMI shielding gasket including non-conductive and metallized filaments.

FIGS. 4 and 5 depict two additional embodiments of the invention wherein an EMI shielding gasket 30 includes both non-conductive filaments 34 and metallic or metallized filaments 38. In this embodiment of the invention, EMI shielding is provided by the metallic or metallized filaments 38 which extend through the base 32. Accordingly, energy absorbed by those filaments in the course of EMI shielding is dissipated to ground through the base 32, to the electrically conductive skin 36.

Figure 6:
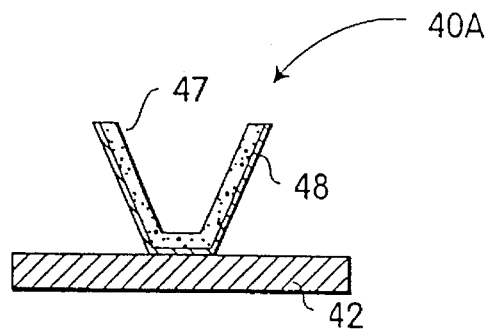
FIG. 6 is a cross-section view of an inventive EMI shielding gasket including a metallic shielding member having a polymeric backing.
Figure 7:
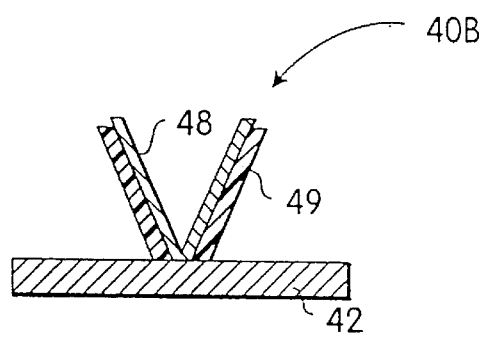
FIG. 7 is a cross-section view of an inventive EMI shielding gasket including a metallic shielding member having foam backing.

Two further embodiments of the invention are shown in FIGS. 6 and 7 which depict EMI shielding gaskets 40A and 40B each of which includes an EMI shielding member 48 connected by, for example, ultrasonic welding to a base 42. In FIG. 6 the shielding member 48 is supported by a resilient foam backing 47 while in FIG. 7 the shielding member 48 is supported by a resilient, electrically conductive polymeric backing 49. Both the foam backing 47 and the conductive polymeric backing 49 provide the shielding member 48 with the resilience it needs to remain upright throughout repeated openings and closings of the door or access panel with which the gasket 40 interacts.

In these embodiments of the invention, the gasket base 42 is typically formed by extrusion of a conductive polymer as discussed above. For example, a blend of approximately 85% by weight of thermoplastic rubber and approximately 15% by weight of electrically conductive carbon black particles performs well. Again, the electrical conductivity of the base allows energy absorbed by the shielding member 28 to be dissipated to ground. For this purpose, the shielding member 48 must be in electrical contact with the base 42. As shown in FIG. 6, therefore, the resilient foam member 47 is arranged inside of the shielding member 48, the shielding member 48 thereby being in electrical contact with the base 42 at its connection point to the base. In the case of the gasket 40B, due to the electrical conductivity of the polymeric backing 49, its placement in relation to the shielding member 48 and the base 42 is less critical as far as electrical conductivity is concerned. That is, since the polymeric backing 49 is electrically conductive, it may be placed between the shielding member 48 and the base 42 without interrupting the flow of electric current desirable for dissipating energy absorbed by the shielding member.

Figure 8:
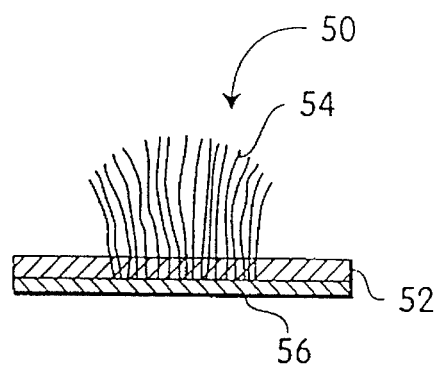
FIG. 8 is a cross-section view of an inventive EMI shielding gasket having metallized filaments embedded in an extruded base.

FIG. 8 shows still another embodiment of the invention wherein an EMI shielding gasket 50 includes EMI shielding filaments 54. The filaments 54 are embedded in and pass through the base 52. Accordingly, an electrically conductive skin, covering, or coating is not necessary to complete the electrically conductive path from the filaments 54 to the back of the base 52.

In the illustrated embodiment, the filaments 54 extend through the base 52 to contact an electrical contact member 56 provided on the back of the base 52. The electrical contact member 56 facilitates electrical contact between the filaments 54 and an electrically conductive path to ground. The electrical contact member 56 may be formed of the same material which forms the electrically conductive skins discussed above. Any number of other types of material are suitable as well, such as electrically conductive adhesives (which could also serve to anchor the gasket 50 in place) or various metals suitable for being arranged in intimate contact with the body with which the gasket 50 is to be arranged, such as body B1 of FIG. 2.

The above description sets forth several embodiments of EMI shielding gaskets constructed in accordance with the teachings of the invention. While the description is intended as instructive, it should be interpreted as illustrative rather than limiting, in that various alterations to the described embodiments will be apparent to those skilled in the art. Such variations are intended to be embraced within the spirit and scope of the invention, which is to be defined not by the preceding description, but by the claims that follow.

What is claimed is:

1. A gasket for shielding electromagnetic interference passing through a seam between first and second electrically conductive bodies, the gasket comprising a base for securing the gasket to a first, electrically conductive body, a metallized fin projecting substantially perpendicularly from the base to contact a second, electrically conductive body when electromagnetic interference passing through a seam between the bodies is to be shielded, a multiplicity of discrete, elongate filaments projecting from the base and substantially parallel to the metallized fin, some of the filaments being in contact with the fin so as to support the fin, and electrically conductive means arranged with the base, for conducting electric current between the fin and the first, electrically conductive body.

2. A gasket as set forth in claim 1 wherein the filaments are electrically conductive.

3. A gasket as set forth in claim 1 wherein the electrically conductive means comprises an electrically conductive coating laid over the base and in contact with the metallized fin.

4. A gasket as set forth in claim 2 wherein the electrically conductive means comprises an electrically conductive coating laid over the base and in contact with some of the filaments.

5. A gasket as set forth in claim 1 wherein the electrically conductive means comprises an electrically conductive material embedded in the base.

6. A gasket as set forth in claim 1 wherein the base comprises an electrically conductive material and thereby forms the electrically conductive means.

7. A gasket as set forth in claim 1 wherein the electrically conductive means comprises an electrically conductive skin wrapped at least partially around the base.

8. A gasket for shielding electromagnetic interference and environmental effects from passing through a seam between first and second electrically conductive bodies, the gasket comprising an elongate base for securing the gasket to a first electrically conductive body adjacent a seam defined by the first and second electrically conductive bodies, a multiplicity of discrete, elongate, fiber filaments projecting substantially perpendicularly from the base and configured so that a substantial amount of the filaments contacts the second electrically conductive body when environmental effects and electromagnetic interference passing through a seam between the bodies is to be shielded, a multiplicity of discrete, elongate, metallized filaments arranged along a strip region bounded on both sides by the fiber filaments for shielding electromagnetic interference passing through the seam, and electrically conductive means arranged with the base for conducting electric current between the metallized filaments and the first electrically conductive body.

9. A gasket as set forth in claim 8 wherein the electrically conductive means comprises an electrically conductive coating laid over the base and in electrically conductive contact with the metallized filaments.

10. A gasket as set forth in claim 8 wherein the electrically conductive means comprises an electrically conductive material embedded in the base.

11. A gasket as set forth in claim 8 wherein the base comprises an electrically conductive material and thereby forms the electrically conductive means.

12. A gasket as set forth in claim 8 wherein the electrically conductive means comprises an electrically conductive skin wrapped at least partially around the base.

13. A gasket for shielding electromagnetic interference passing through a seam between first and second electrically conductive bodies, the gasket comprising a base for securing the gasket to a first, electrically conductive body, a metallized fin projecting substantially perpendicularly from the base to contact a second, electrically conductive body when electromagnetic interference passing through a seam between the bodies is to be shielded, a resilient substrate formed of an electrically conductive polymer cooperating with the metallized fin for maintaining the metallized fin in contact with the second, electrically conductive body, electrically conductive means arranged with the base, for conducting electric current between the fin and the first, electrically conductive body.

14. A gasket for shielding electromagnetic interference passing through a seam between first and second electrically conductive bodies, the gasket comprising a base for securing the gasket to a first, electrically conductive body, a metallized fin projecting substantially perpendicularly from the base to contact a second, electrically conductive body when electromagnetic interference passing through a seam between the bodies is to be shielded, a resilient substrate formed of a thermoplastic elastomeric material cooperating with the metallized fin for maintaining the metallized fin in contact with the second, electrically conductive body, electrically conductive means arranged with the base, for conducting electric current between the fin and the first, electrically conductive body.

15. A gasket as set forth in claim 14 wherein the thermoplastic elastomeric material forming the resilient substrate is electrically conductive.

16. A gasket as set forth in claim 14 wherein the electrically conductive means comprises an electrically conductive coating laid over the base and in contact with the metallized fin.

17. A gasket as set forth in claim 14 wherein the electrically conductive means comprises an electrically conductive material embedded in the base.

18. A gasket as set forth in claim 14 wherein the base comprises an electrically conductive material and thereby forms the electrically conductive means.

19. A gasket as set forth in claim 14 wherein the electrically conductive means comprises an electrically conductive skin wrapped at least partially around the base.

20. A gasket for shielding electromagnetic interference passing through a seam between first and second electrically conductive bodies, the gasket comprising a base for securing the gasket to a first, electrically conductive body, a plurality of metallized fins projecting substantially perpendicularly from the base to contact a second, electrically conductive body when electromagnetic interference passing through a seam between the bodies is to be shielded, resilient means cooperating with the plurality of metallized fins for maintaining the metallized fins in contact with the second, electrically conductive body, electrically conductive means arranged with the base, for conducting electric current between the fin and the first, electrically conductive body.

21. A gasket as set forth in claim 20 wherein each of the plurality of metallized fins includes a resilient component which provides the resilient means cooperating with the fins for maintaining the fins in contact with the second, electrically conductive body.

22. A gasket as set forth in claim 20 wherein the electrically conductive means comprises an electrically conductive coating laid over the base and in electrically conductive contact with the metallized fins.

23. A gasket as set forth in claim 20 wherein the electrically conductive means comprises an electrically conductive material embedded in the base.

24. A gasket as set forth in claim 20 wherein the base comprises an electrically conductive material and thereby forms the electrically conductive means.

25. A gasket as set forth in claim 20 wherein the electrically conductive means comprises an electrically conductive skin wrapped at least partially around the base.

26. A gasket as set forth in claim 20 wherein the resilient means comprises a plurality of resilient substrates which support the plurality of metallized fins.

27. A gasket as set forth in claim 26 wherein the resilient substrates comprise an electrically conductive polymer.

28. A gasket as set forth in claim 26 wherein the resilient substrates comprise a thermoplastic elastomeric material.

* * * * *